United States Patent
Iwata et al.

(10) Patent No.: US 7,039,781 B2
(45) Date of Patent: May 2, 2006

(54) FLASH MEMORY APPARATUS AND METHOD FOR MERGING STORED DATA ITEMS

(75) Inventors: Kazuya Iwata, Katano (JP); Shigekazu Kogita, Ibaraki (JP); Akio Takeuchi, Takatsuki (JP)

(73) Assignee: Matsushtia Electric Industrial Co., Ltd., Osaka (JP)

(*) Notice: Subject to any disclaimer, the term of this patent is extended or adjusted under 35 U.S.C. 154(b) by 45 days.

(21) Appl. No.: 10/481,921

(22) PCT Filed: Jul. 23, 2002

(86) PCT No.: PCT/JP02/07456

§ 371 (c)(1),
(2), (4) Date: Dec. 24, 2003

(87) PCT Pub. No.: WO03/012647

PCT Pub. Date: Feb. 13, 2003

(65) Prior Publication Data

US 2004/0193774 A1 Sep. 30, 2004

(30) Foreign Application Priority Data

Jul. 27, 2001 (JP) .............................. 2001-228497

(51) Int. Cl.
*G06F 12/12* (2006.01)
(52) U.S. Cl. ...................... 711/165; 711/103; 707/205; 707/206
(58) Field of Classification Search ................ 711/165, 711/103, 1, 5, 102, 166, 159, 170; 707/205, 707/206; 718/105; 365/218, 230.03, 185.29, 365/185.33
See application file for complete search history.

(56) References Cited

U.S. PATENT DOCUMENTS

| 5,717,953 | A | | 2/1998 | Tsutsui |
| 5,802,551 | A | * | 9/1998 | Komatsu et al. ............. 711/103 |
| 5,933,847 | A | * | 8/1999 | Ogawa ........................ 711/103 |
| 5,983,312 | A | | 11/1999 | Komatsu |
| 6,125,424 | A | | 9/2000 | Komatsu |
| 6,161,163 | A | | 12/2000 | Komatsu |
| 6,418,506 | B1 | * | 7/2002 | Pashley et al. ............. 711/103 |
| 6,584,579 | B1 | | 6/2003 | Komatsu |
| 6,604,168 | B1 | | 8/2003 | Ogawa |
| 6,622,199 | B1 | * | 9/2003 | Spall et al. ................. 711/103 |
| 6,766,409 | B1 | | 7/2004 | Komatsu |

(Continued)

FOREIGN PATENT DOCUMENTS

JP 6-222985 A 8/1994

(Continued)

*Primary Examiner*—B. James Peikari
(74) *Attorney, Agent, or Firm*—Akin Gump Strauss Hauer & Feld, LLP

(57) ABSTRACT

A flash memory system is disclosed. The flash memory system includes a flash memory comprising more than one physical block and more than one page, where each page can be in an enabled state, a blank state or a disabled state. In use, a merge control section reads data on an enabled page from a predetermined physical block using a read section, and writes the data onto a blank page using a write section, thereby copying the data on the enabled page onto the blank page. A merge control section then disables the enabled page using a page-disabling section. When the copying of the data from all the enabled pages in the predetermined physical block is finished, the merge control section collectively erases all the data in the physical block using an erase section.

8 Claims, 10 Drawing Sheets

| U.S. PATENT DOCUMENTS | | | |
|---|---|---|---|
| 6,845,438 B1 | 1/2005 | Tanaka | |
| 2001/0023472 A1* | 9/2001 | Kubushiro et al. | 711/103 |
| 2004/0168013 A1 | 8/2004 | Komatsu | |
| 2004/0168017 A1 | 8/2004 | Hayashi | |
| 2005/0005059 A1 | 1/2005 | Tanaka | |
| 2005/0007865 A1 | 1/2005 | Tanaka | |

| FOREIGN PATENT DOCUMENTS | | |
|---|---|---|
| JP | 6-301601 A | 10/1994 |
| JP | 7-105691 A | 4/1995 |
| JP | 9-97207 A | 4/1997 |
| JP | 9-161491 A | 6/1997 |
| JP | 10-124384 A | 5/1998 |

\* cited by examiner

FLASH MEMORY APPARATUS AND METHOD FOR MERGING STORED DATA ITEMS

CROSS-REFERENCE TO RELATED APPLICATION

This application is a Section 371 of International Application No. PCT/JP02/07456, filed Jul. 23, 2002, the disclosure of which is incorporated herein by reference.

TECHNICAL FIELD

The present invention relates to a flash memory system comprising flash memories and, in particular, a method for merging data items stored in each of the flash memories.

BACKGROUND ART

A portable information processing device, such as a notebook computer, personal digital assistant (PDA), or digital camera, records large quantities of digital data, such as image data, in an internal recording medium. A recording medium that is compact, lightweight and has a large-recording-capacity is desirable. In particular, a portable information processing device, such as a digital video camera (DVC) or an audio player, must record or reproduce large quantities of data from a recording medium in real time. Accordingly, a recording medium that can manipulate large quantities of data at a high speed is desirable.

Furthermore, a portable information processing device must operate for a long period of time using only an internal power supply such as a battery. Accordingly, a recording medium that reduces power consumption during input/output and storing of data is desirable.

In addition, portable information processing devices must exchange data among various other information processing devices. For example, image data taken with a digital still-video camera (DSC) may be printed using a printer, subjected to digital processing using a personal computer, transmitted using a cellular phone, or reproduced on a television screen. Accordingly, a recording medium that facilitates the sharing of data among the various information processing devices is desirable.

Examples of recording media that meet the above-mentioned requirements include semiconductor memories, flexible disks, hard disks, optical disks, and soon. In particular, card-type recording media with built-in flash memories, such as PC cards, (which are hereafter referred to as flash memory cards) are typical. In use, a flash memory card is inserted into the specific slot of the information processing device and exchanges data with the information processing device. The specific slot arrangement complies with a predetermined standard for flash memory cards. The information processing devices with the specific slots can exchange data with each other through the same flash memory card.

In contrast to a RAM, a flash memory can hold data stored therein for a long time without power consumption. Furthermore, a flash memory can electrically rewrite data in contrast to a ROM. In those respects, a flash memory has advantages as the above-mentioned recording medium over a RAM and a ROM.

A flash memory is generally divided into more than one page each having a fixed number of memory cells, and further divided into more than one physical block each having a fixed number of the pages. Each of the memory cells can assume two states, "1" and "0". Therefore, each one of the memory cells can store one-bit data therein. The memory cell of a flash memory, NAND-type flash memory for example, comprises the characteristics related to the transition between two states, "1" and "0". The memory cells in the "1" state can change into the "0" state one by one. On the other hand, the memory cells in the "0" state can change into the "1" state only when all the cells belonging to the same physical block change collectively. Therefore, data stored in the flash memory can only be erased collectively in each of the physical blocks. As used above, data is "erased" by initializing of all the memory cells inside the physical block into the "1" state. On the other hand, data writing into the flash memory is enabled on the data-erased pages. As used above, "data writing" means causing some of the memory cells to change from the "1" state to the "0" state.

The flash memory cannot overwrite data with new data on the same page in which data has already been stored. The reason is as follows: in the NAND-type flash memory, for example, the memory cells in the "0" state cannot individually change into the "1" state. Accordingly, overwriting of data with other data on the same page requires prior erasing of data in the whole of the physical block including the page. Accordingly, the time required for the overwriting of the flash memory is longer than that of a RAM, with the difference being the time required for the erasing of the data.

For example, Published Japanese patent application No. H6-301601 gazette discloses a storage device that achieves high-speed data writing into flash memories. The storage device writes data into more than one flash memory or more than one physical block in parallel, thereby shortening the writing duration.

FIG. 10 is the block diagram showing an example of data exchange between a conventional flash memory card 100 and an information processing device H (which is hereafter referred to as a host). The flash memory card 100 is connected with the host H through, for example, 5 types of lines; a data line DAT, a clock line CLK, a power line VDD, a ground line VSS, and a command line CMD.

A host interface 1 receives commands from the host H through the command line CMD and decodes the commands. When the command is a write command, for example, the host interface 1 decodes the command into a logical address AL provided by the host H as the writing destination of data, and sends the address to the flash memory controller 30. On the other hand, the host interface 1 receives data objects Da to be written from the data line DAT and stores the objects in a buffer 2.

In the flash memory controller 30, an address conversion section 30a is fed from the host interface 1 with the logical address AL representing the destination of the data object Da. The address conversion section 30a brings the physical addresses of generally more than one area into correspondence with one logical address. Here, one area is equivalent to, for example, two pages inside the cell array 4b of the flash memory 4. In particular, the pages belonging to the same area each belong to separate physical blocks. The address conversion section 30a further classifies a plurality of the areas corresponding to the same logical address into three states; blank, enabled, and disabled states. Information about the state of each of the areas is stored in a redundant area added to each of the pages of the flash memory 4. Here, the redundant area consists of a fixed number of the memory cells. Furthermore, the common information about the state of the area is stored in the redundant areas of the pages belonging to the same area. The blank state represents that data has not yet been written in the area after erasing of data.

On the other hand, the enabled and disabled states are the states of the area in which data is written. The enabled and disabled states represent respectively, that the read section 30b is allowed to perform reading of data and prohibited from performing reading of data. The address conversion section 30a, when fed the logical address AL representing the writing destination of the data object Da, selects a blank area in the cell array 4b and assigns the write target area of the data object Da to the blank area. The address conversion section 30a further brings the physical address AP of the area in correspondence with the above-mentioned logical address AL.

A write section 30c sends the physical address AP of the write target area to the address decoder 4c of the flash memory 4. In conjunction with that, the write section 30c sends the data object Da from the buffer 2 to the page buffer 4a of the flash memory 4.

A flash memory 4 comprises, for example, two page buffers 4a. Each of the page buffers 4a can store one page of data. In other words, the two page buffers 4a can store one area of data in total. Accordingly, the data objects Da to be written, which are sent out from the buffer 2, are stored in the page buffers 4a on an area-by-area basis. The one-area of data items stored in the two page buffers 4a are written in parallel onto the two pages designated by the address decoder 4c. Thus, the conventional flash memory card 100 performs the data writing into the flash memory 4 in the two physical blocks in parallel, thereby shortening the writing duration.

The address conversion section 30a, when fed the logical address AL representing the writing destination of the data object Da, retrieves data from an enabled area among the physical addresses corresponding to the logical address AL, together with the above-mentioned operations. When the writing operation ordered by the host is an overwriting operation, an enabled area generally exists among the areas that have the physical addresses corresponding to the logical address AL representing the writing destination of the data object Da. At the same time, a page-disabling section 30e inside the flash memory controller 30 disables the enabled area as described below, thereby prohibiting the read section 30b from accessing the area. The page-disabling section 30e rewrites the data inside the redundant area corresponding to the enabled page, thereby disabling the page. For example, the section defines the page state as being enabled and disabled when a predetermined bit (which is hereafter referred to as a flag) inside the redundant area is "1" and "0", respectively. Since the flag corresponding to the enabled page is "1", the page-disabling section 30e changes the flag from "1" into "0". In other words, the section writes "0" into the flag of the redundant area. Thereby disabling the page.

As described above, the conventional flash memory card 100, when requested by a host to overwrite data, writes new data in another area without erasing original data. Furthermore, the card brings the physical address of the area in which the new data is written into correspondence with the logical address showing the writing destination. In addition, the card disables the state for the areas in which the original data is stored. Consequently, the read section 30b, when receiving a read command aimed at the logical address from the host, accesses the area in which the latest data items are stored among a plurality of the areas corresponding to the logical address. Thus, the overwriting at the same logical address is realized without erasing of data in the flash memory. Therefore, the overwriting duration is reduced by the erasing duration.

In the conventional flash memory system like the above-described one, each of the overwriting operations at the same logical address entails the disabling of the enabled area in which the original data is stored. The result is an increase in the number of the disabled areas. Accordingly, when the overwriting operation is repeated many times at the same logical address, the number of the disabled areas seriously increases compared with that of the enabled areas. Conventional flash memory systems capable of managing links between the enabled areas belonging to the separate physical blocks, fragment data streams such as files into areas, and writes the data streams discretely and randomly in blank areas scattered across the various physical blocks. In such a flash memory system, the per-physical-block rate of the disabled areas to the enabled areas is generally high because of the repetition of the overwriting operation.

In a flash memory, data items are erased only collectively in each of the physical blocks. Therefore, the conventional flash memory system cannot perform data erasing for many disabled areas inside the erasing target physical block when the physical block includes even one enabled area. Accordingly, the ratio of the disabled areas to the enabled areas cannot be reduced. As a result, in the conventional flash memory system, the repetition of the overwriting operation seriously reduces the amount of data that can be stored in the flash memory compared with the storage capacity of the flash memory.

An object of the present invention is to provide a flash memory system that reduces the ratio of disabled pages to enabled pages, thereby achieving an increase in the amounts of data that can be stored therein.

BRIEF SUMMARY OF THE INVENTION

Briefly stated the present invention is a flash memory system. The system comprises a flash memory comprising more than one physical block including more than one page having a fixed memory capacity and three states, namely, blank, enabled, and disabled states; an address conversion section for converting a logical address entered from the outside into one of the corresponding physical addresses of the pages; a read section for reading data from the enabled page; a write section for writing data onto each of the blank pages; an erase section for collectively erasing data in each of the physical blocks; a page-disabling section for disabling the enabled pages; and a merge control section for selecting a source among the physical blocks, and for copying data on a predetermined number of the enabled pages belonging to the source physical block onto the blank pages using the read and write sections.

Here, the three states of the page are defined as follows. The blank state represents that data have not yet been written in the page after erasure of data. On the other hand, the enabled and disabled states are the states of the page in which data is written. The enabled and disabled states represent that the read section is allowed to read and prohibited from reading data from the page, respectively.

The above-described flash memory system particularly performs the overwriting of data at a logical address received from the outside as follows. At the time of a writing operation, the address conversion section converts the above-mentioned logical address into the physical address of a blank page. The write section writes new data received from the outside onto the page at the physical address. On the other hand, the page-disabling section disables the enabled page on which the original data is stored. Consequently, when reading data from the above-mentioned logical address, the read section accesses the page in which the new data is written in place of the above-mentioned disabled page. Thus, the above-described flash memory system realizes the overwriting of data at the same logical address without performing erasure of data. Therefore, the overwriting duration shortens by the duration required to erase data.

Furthermore, in the above-described flash memory system, the merge control section reads data on enabled pages from a predetermined physical block using the read section, and writes the data onto separate blank pages using the write section. Consequently, data on enabled pages inside the predetermined physical block can be copied into other physical blocks. In particular, when the data copying is finished on all the enabled pages inside the predetermined physical block, the erase section collectively erases data in the physical block. Thereafter, the copying of data on the enabled pages and the subsequent erasure of data in the physical block are referred to as a merge process. The above-described flash memory system can erase data through the merge process on the disabled pages in the physical block that includes enabled pages, in contrast to conventional systems. Accordingly, the above-described flash memory system can reduce the rate of the disabled pages to the enabled pages. As a result, the amount of data that can be stored when overwriting is repeated is larger than that in the conventional systems.

In one aspect of the invention, when the write section writes new data, the merge control section counts the number of the physical blocks including only the blank pages; when obtaining a count equal to or smaller than a first threshold value, selects the source physical block; selects, as a source page, the enabled page belonging to the source physical block and at least, as many as the pages on which the new data is written; copies data on the source page onto the blank page; disables the source page using the page-disabling section; and performs erasing of data using the erase section for the physical block including none of the enabled pages.

If the merge process is performed at every time of the writing of new data, the writing duration is longer by the duration of the merge process than that in the conventional flash memory system. Thus, when new data is written in the above-described flash memory system, the merge control section counts the number of the physical blocks that include only blank pages (which are hereafter referred to as blank physical blocks). When the count is smaller than the first threshold value, that is, the area available for the data writing is smaller than a predetermined size, the merge control section performs the merge process. Thus, the above-described flash memory system can reduce the extension of the writing duration due to the merge process by the restriction on the execution timing of the merge process.

Furthermore, the amount of data objects to be written is generally equal to the storage capacity on the order of the integral multiple of the physical block. Then, the merge control section adjusts the number of the source pages to the number equal to or more than the number of the pages on which new data is written. Consequently, when data is overwritten at the same logical address, the number of the physical blocks erased through the merge process can be adjusted to the approximate number of or more than the number of the blank physical blocks consumed by writing of new data. As a result, the above-described flash memory system avoids an increase in the ratio of the disabled pages to the enabled pages when the overwriting of data is repeated.

In another aspect, when the write section writes new data, the merge control section counts the number of the physical blocks including only the blank pages (namely, the blank physical blocks); when obtaining the count equal to or smaller than a second threshold value, prohibits the write section from writing new data and selects the source physical block; copies all data on the enabled pages belonging to the source physical block onto the blank pages belonging to one of the physical blocks different from the source physical block; and erases the data in the source physical block using the erase section.

This flash memory system provides the merge process with a higher priority than the writing operation of new data when the remaining number of the physical blocks is smaller than the second threshold value. Consequently, the ratio of the disabled pages to the enabled pages is reduced so that the number of the blank physical blocks is greater than or equal to the second threshold value. As a result, the above-described flash memory system may increase the amounts of data that can be stored.

When the above-described flash memory system performs both the above-described operation in the case of the remaining number of the blank physical blocks equal to or smaller than the first threshold value and the above-described operation in the case of the remaining number equal to or smaller than the second threshold value, the second threshold value is smaller than the first threshold value. Consequently, the merge process does not take precedence over the writing operation of new data until the blank physical blocks are too small in number to allow the writing of new data therein. As a result, the extension of the writing duration due to the merge process can be reduced.

The above-described flash memory system may further comprise an address memory for storing a list of the addresses of the physical blocks and the numbers of the disabled pages belonging to the physical blocks. The merge control section, when selecting the source physical block, accesses the address memory and consults the above-mentioned list. Thereby, the section can select the source physical blocks easily and quickly in decreasing order of the number of the disabled pages that the physical blocks include. As a result, the time required to the above-described merge process can shorten since the number of the enabled pages whose data should be copied is minimized.

In an additional aspect, wherein a predetermined number of the pages belonging to each of the separate physical blocks are assigned to one area; the read section reads data from more than one of the enabled pages belonging to the same area in parallel; the write section writes data onto more than one of the blank pages belonging to the same area in parallel; and the page-disabling section disables all of the enabled pages belonging to the same area.

This flash memory system always performs input and output of data to and from the flash memory on an area-by-area basis, that is, more than one page in parallel. Accordingly, the system operates at speeds faster than that of the flash memory systems performing input and output of data to and from the flash memory on a page-by-page basis.

In a further aspect, wherein the flash memory system comprises two or more of the flash memories; and at least two of the read section, the write section, the erase section, the page-disabling section, and the merge control section operate in parallel with each other for the respective flash memories.

In this flash memory system, for example, the write section writes new data in one of the flash memories. In parallel with that, the merge control section performs the merge process in another of the flash memories. Consequently, the extension of the writing duration due to the merge process can be reduced compared to that of the flash memory system that includes only one flash memory.

In another aspect, a method for merging data items stored in a flash memory is the method for merging data items stored in the flash memory comprising more than one physical block including more than one page having a fixed memory capacity and three states, namely, blank, enabled, and disabled states, and comprises the steps of selecting a source among the physical blocks; copying data on a predetermined number of the enabled pages belonging to the source physical block onto the blank pages; and erasing data in each of the physical blocks.

This method for merging copies data on the enabled pages inside a predetermined physical block into another physical block and erases data in the physical block collectively. Through such a merge process, data on the disabled pages of the physical blocks, including enabled pages, can be erased. Therefore, the above-described method for merging can reduce the ratio of the disabled pages to the enabled pages. As a result, the amounts of data that can be stored in the flash memory can increase.

Another aspect of the present invention is the method for merging data items stored in the flash memory comprising more than one physical block including more than one page having a fixed memory capacity and three states, namely, blank, enabled, and disabled states, and comprises the steps of: counting the number of the physical blocks including only the blank pages; comparing the count with a first threshold value; performing writing of new data and obtaining the number of the target pages of the writing when the count is equal to or smaller than the first threshold value; selecting a source among the physical blocks; selecting, as a source page, the enabled page (a) belonging to the source physical block, and (b) at least, as many as the pages on which the new data is written; copying data on the source page onto the blank page; disabling the source page; selecting the physical block including none of the enabled pages as an erasing target physical block; and erasing data in the erasing target physical block.

This method for merging performs the merge process when the number of the blank physical blocks is smaller than the first threshold value, in other words, when the area available for the data writing is smaller than a predetermined size. Accordingly, the restriction on the execution timing of the merge process can reduce the extension of the writing duration due to the merge process.

Furthermore, the amount of data objects to be written is generally equal to the storage capacity on the order of the integral multiple of the physical block. In the above-described method for merging, the number of the source pages is equal to or more than the number of the target pages of writing of new data. Accordingly, the physical blocks that become erasable by the copy of the data on the enabled pages can increase in number to the order of or more than the number of the blank physical blocks consumed by the writing of new data, especially when data is overwritten at the same logical address. As a result, the above-described method for merging can avoid the increase in the rate of the disabled pages to the enabled pages when the overwriting of data is repeated.

According to still another aspect of the present invention is the method for merging data items stored in the flash memory comprising more than one physical block including more than one page having a fixed memory capacity and three states, namely, blank, enabled, and disabled states, comprises the steps of: counting the number of the physical blocks including only the blank pages (namely, the blank physical blocks); comparing the count with a second threshold value; prohibiting writing of new data when the count is equal to or smaller than the second threshold value; selecting a source among the physical blocks; selecting, as source pages, all data items on the enabled pages belonging to the source physical block; copying the data item on the source page onto the blank page belonging to the physical block different from the source physical block; and erasing data in the source physical block.

This method for merging provides the merge process with a higher priority than the writing operation of new data when the remaining number of the blank physical blocks is smaller than the second threshold value. Consequently, the ratio of the disabled pages to the enabled pages is reduced so that the number of the blank physical blocks is approximately equal to or greater than the second threshold value. As a result, the amounts of data that can be stored in the flash memory can increase in the above-described method for merging.

When the above-described method for merging includes both the above-described merge process in the case of the remaining number of the blank physical blocks equal to or smaller than the first threshold value and the above-described merge process in the case of the remaining number equal to or smaller than the second threshold value, the second threshold value is smaller than the first threshold value. Consequently, the merge process does not take precedence over the writing operation of new data until the blank physical blocks are too small in number to allow the writing of new data therein. As a result, the extension of the writing duration due to the merge process can be reduced.

In the above-described method for merging, the step of selecting the source physical block may comprise the sub-step of consulting a list of the addresses of the physical blocks and the numbers of the disabled pages that belong to the physical blocks. Consequently, the source physical block can be selected easily and quickly in decreasing order of the number of the disabled pages that the physical blocks include. As a result, the time required to the above-described merge process can shorten since the number of the enabled pages whose data should be copied is minimized.

While the novel features of the invention are set forth particularly in the appended claims, the invention, both as to organization and content, will be better understood and appreciated, along with other objects and features thereof, from the following detailed description taken in conjunction with the drawings.

BRIEF DESCRIPTION OF THE DRAWINGS

FIG. 5 is a schematic diagram showing changes in the states of the pages inside the flash memory 4 during the first merge process S3 according to Embodiment 1 of the present invention;

Figure 1:
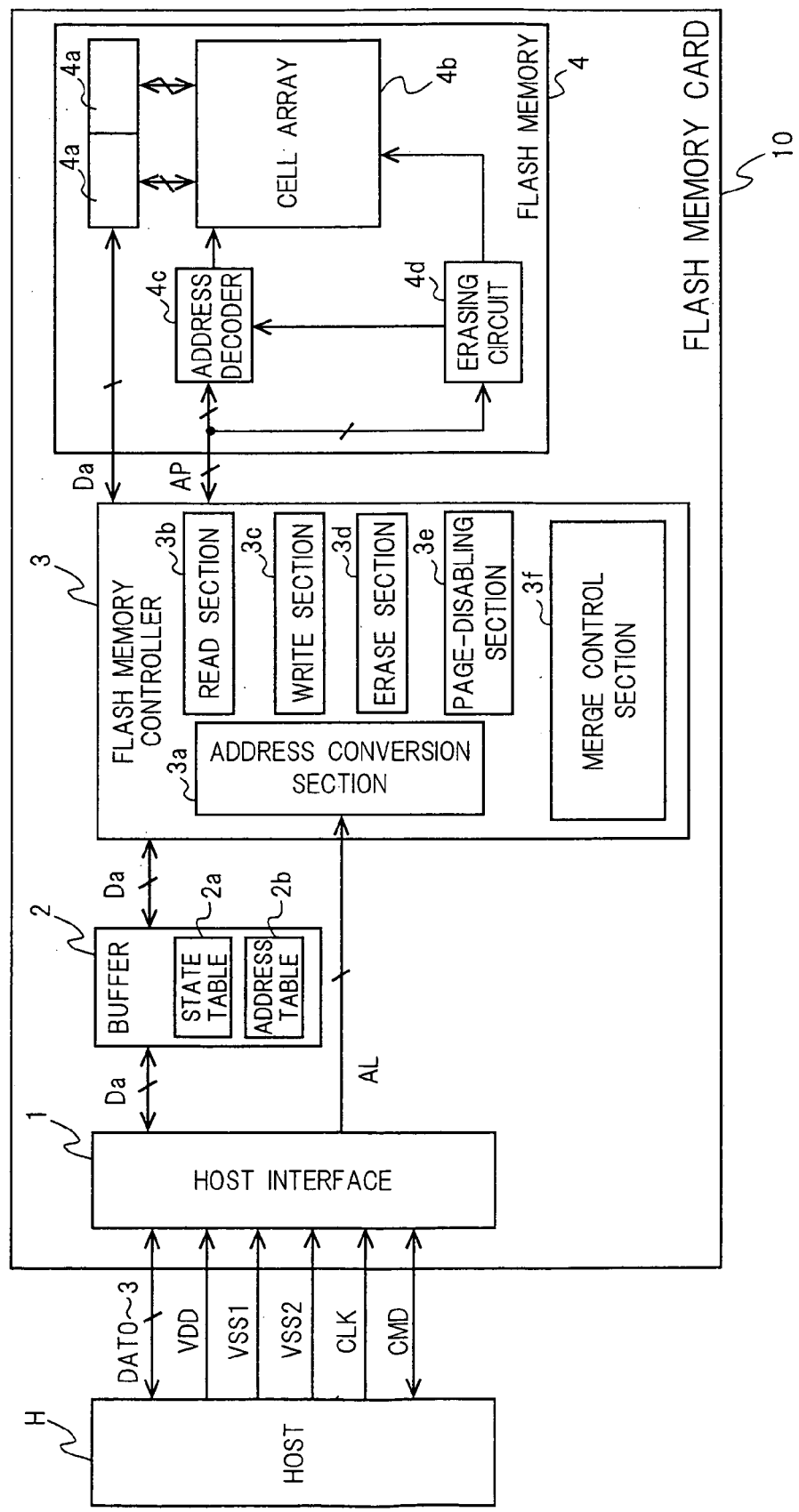
FIG. 1 is a block diagram showing data exchanges between a flash memory card 10 according to Embodiment 1 of the present invention and a host H.

It will be recognized that some or all of the Figures are schematic representations for purposes of illustration and do not necessarily depict the actual relative sizes or locations of the elements shown.

DETAILED DESCRIPTION OF THE PREFERRED EMBODIMENTS

The following explains the best mode for carrying out the present invention by describing some preferable Embodiments and referring to the drawings.

Embodiment 1

FIG. 1 is a block diagram showing data exchanges between a flash memory card 10 according to Embodiment 1 of the present invention and a host H. The flash memory card 10 is connected with the host H through the following five types of lines. The lines are composed of nine lines in total; four data lines DAT0–3, a clock line CLK, a power line VDD, two ground lines VSS1 and VSS2, and a command line CMD.

A host interface 1 is the circuit for performing communications directly with the host H through the above-mentioned nine lines. The host interface 1 receives commands from the host H through the command line CMD and decodes the commands. After that, the host interface performs, for example, the following operations in response to the commands. When a command from the host H is a read command, the host interface 1 decodes the command into the logical address AL of the read target and sends the address to a flash memory controller 3. When a command from the host H is a write command, the host interface 1 decodes the command into the logical address AL of the write target and sends the address to the flash memory controller 3. On the other hand, the host interface 1 reads data objects to be written from the data lines DAT0–3 in synchronization with a transfer clock received from the clock line CLK, and stores the data objects in the buffer 2. When a command from the host H is an erase command, the host interface 1 decodes the command into the logical address AL of the erase target and sends the address to the flash memory controller 3.

Preferably the buffer 2 is an SRAM. and the buffer 2 temporarily stores the data objects Da exchanged between the host interface 1 and the flash memory controller 3. Consequently, the host interface 1 and the flash memory controller 3 can exchange data objects Da with each other without being obstructed by a difference in operating speeds, that is, a difference in frequency between the transfer clock CLK from the host H and the internal clock of the flash memory card 10. In addition, the buffer 2 provides the host interface 1 and the flash memory controller 3 with respective working memory spaces.

Flash memories 4 are NAND-type EEPROM (electrically erasable programmable ROM) preferably, and include a page buffer 4a, a cell array 4b, an address decoder 4c, and an erasing circuit 4d.

Figure 2:
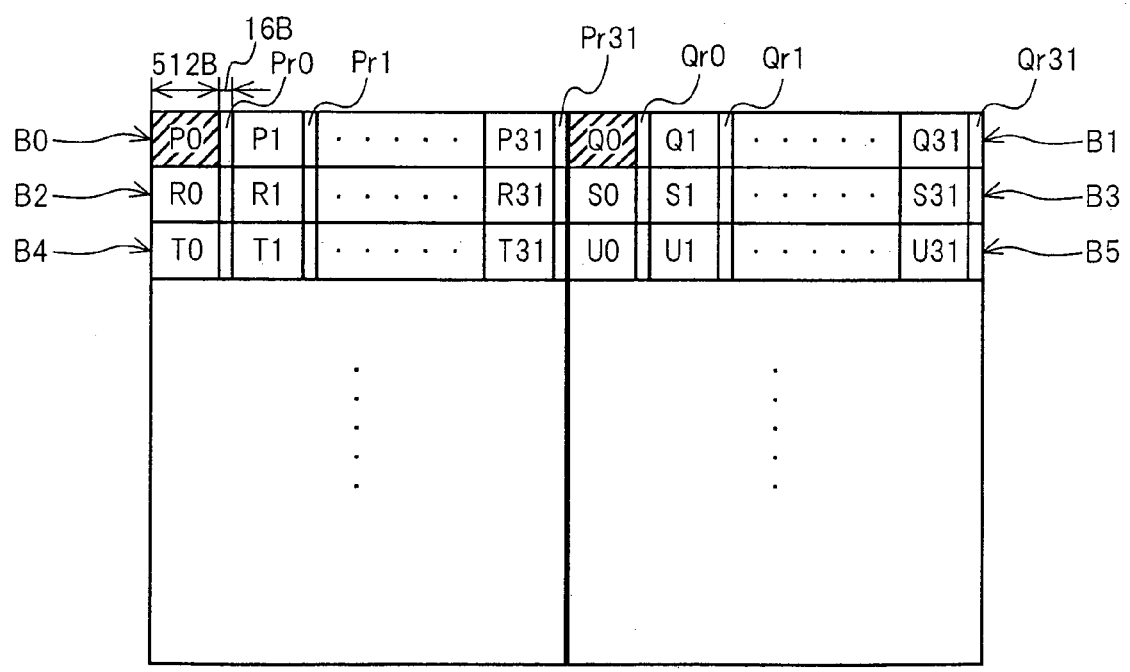
FIG. 2 is a schematic diagram showing the structure of a cell array 4*b* inside a flash memory 4 according to Embodiment 1 of the present invention.

FIG. 2 is a schematic diagram showing the structure of the cell array 4b. The cell array 4b is an assembly of a plurality of the physical blocks B0, B1, B2, etc. Each of the physical blocks has the following two-dimensional arrangement of many memory cells: eight memory cells connected in the NAND type compose one line and 512 lines compose one page. Furthermore, a redundant area composed of 16 lines is added to every one page. The arrangement of one page with the addition of the redundant area composes one unit, and 32 units compose one physical block. For example, the first physical block B0 includes 32 pages P0–P31. The redundant areas Pr0–Pr31 of 16 bytes each are added to the respective pages P0–P31. Similarly, the second physical block B1 includes 32 pages Q0–Q31, and the redundant areas Qr0–Qr31 are added to the respective pages Q0–Q31. Likewise other of the physical blocks B2, B3, etc.

Since one memory cell stores one bit data, in the cell array 4b, 8 bits=1 byte are stored per one line, 512 bytes per one page, and 512 bytes×32=16 KB per one physical block. Furthermore, in Embodiment 1, the cell array 4b comprises $2^{10}$=1024 of the physical blocks, thus comprising the storage capacity of 16 KB×1024=16 MB.

The flash memory 4 comprises, for example, two page buffers 4a. Each of the page buffers 4a can store one-page data. When data is written into the cell array 4b, data items Da from the flash memory controller 3, in groups of 2×512 bytes, are temporarily stored in the two page buffers 4a. Furthermore, the data items are written in parallel from the respective page buffers 4a onto two separate pages in the cell array 4b. When data is read from the cell array 4b, data items are read in parallel from two separate pages inside the cell array 4b, and temporarily stored in the two respective page buffers 4a. Furthermore, the data items are transferred in parallel from the two page buffers 4a to the flash memory controller 3 as a series of data Da.

Two target pages of writing or reading are selected from separate physical blocks. For example, the two pages shown hatched in FIG. 2, that is, the first pages P0 and Q0 of the first physical block B0 and the second physical block B1, respectively, are selected. Similarly, from one of the odd-numbered physical blocks and one of the even-numbered physical blocks, the respective pages at corresponding positions are selected. At that time, the address decoder 4c performs the selection according to the physical address AP received from the flash memory controller 3. The two-page pair inside the cell array 4b selected in such a manner is hereafter referred to as one area.

The erasing circuit 4d applies a high voltage across the physical block corresponding to the physical address AP received from the flash memory controller 3, thereby collectively erasing data stored inside the physical block. In order to perform the data erasing separately in each of the physical blocks at that time, the physical blocks inside the cell array 4b are electrically insulated from each other.

The flash memory controller 3 performs data input/output control over the flash memory 4 using the components described as follows.

An address conversion section 3a receives a logical address AL from the host interface 1. Furthermore, the section selects the area corresponding to the logical address AL from the inside of the cell array 4b of the flash memory 4, and converts the logical address AL into the physical address AP of the area. Generally, the address conversion section 3a assigns more than one physical address AP of area to one logical address AL. Furthermore, the section classifies a plurality of the areas corresponding to the same logical address AL into three states, namely, blank, enabled, and disabled states, and selects the physical addresses AP of the areas according to the respective states.

The blank state represents that data has not yet been written in the area after the erasure of data. On the other hand, the enabled and disabled states are the states of the area in which data is written. The enabled and disabled states represent that the read section 3b is allowed to read and prohibited from reading data from the area, respectively.

Information about the state of each area is stored in the redundant area added to each page of the flash memory 4 (such as the redundant area Pr0 corresponding to the page P0). In particular, the common information about the state of the area is stored in the redundant areas of the pages belonging to the same area.

The address conversion section 3, at startup of the flash memory card 10, checks the states of all the areas inside the cell array 4b of the flash memory 4. Furthermore, the address conversion section 3 creates, inside the buffer 2, a table 2a regarding the state of each of the areas (which is hereafter referred to as a state table). The state table 2a is, for example, a list of the physical addresses of areas, the logical addresses corresponding to the areas, and the information about the states of the areas.

When a logical address AL shows a target of reading data, the address conversion section 3a consults the state table 2a, thereby selecting an enabled area from among the areas inside the cell array 4b corresponding to the logical address AL. The read section 3b sends the physical address AP of the enabled area to the flash memory 4. The address decoder 4c decodes the physical address AP entered into the flash memory 4. Consequently, data items are read in parallel from the respective pages belonging to the area inside the cell array 4b corresponding to the physical address AP into the two page buffers 4a. The read section 3b transfers the data items Da from the page buffers 4a to the buffer 2.

When a logical address AL shows a target of writing data, the address conversion section 3a consults the state table 2a, thereby selecting blank areas from the inside of the cell array 4b. Furthermore, the address conversion section 3a assigns the physical addresses AP of the blank areas to the logical address AL of the write target. The write section 3c transfers the data objects Da to be written, in groups of 2×512 bytes, from the buffer 2 to the page buffers 4a inside the flash memory 4. In conjunction with that, the section sends the physical address AP of the blank area selected by the address conversion section 3a to the flash memory 4. The address decoder 4c decodes the physical address AP entered in the flash memory 4. Consequently, data items are written in parallel from the different page buffers 4a onto the respective pages belonging to the area inside the cell array 4b corresponding to the physical address AP. Furthermore, at the end of the data writing, the address conversion section 3 updates the state table 2a and rewrites the item regarding the state of the write target area from "blank" to "enabled".

As described above, the writing and reading of data into and from the flash memory 4 are performed through the two page buffers 4a on an area-by-area basis, that is, one page each of the two separate physical blocks in parallel. Thus, the flash memory card 10 according to Embodiment 1 shortens the writing and reading durations for the flash memory 4.

When a logical address AL shows a target of erasing data, the address conversion section 3a identifies the physical address AP of the physical block corresponding to the logical address AL. An erase section 3d sends the physical address AP of the erasing target identified by the address conversion section 3a to the erasing circuit 4d inside the flash memory 4. The erasing circuit 4d stops the address decoder 4c, and applies a predetermined high voltage across the physical block corresponding to the received physical address AP, thereby performing the erasing of data for the physical block. Furthermore, at the end of the data erasing, the address conversion section 3 updates the state table 2a and rewrites "enabled" into the items regarding the states of all the areas inside the physical block of the erasing target.

At the time of the data writing, the address conversion section 3a consults the state table 2a along with the above-described operations, and retrieves an enabled area among the areas of the physical addresses corresponding to the logical address AL of the write target. When the writing requested by the host H is the overwriting of data, generally an enabled area exists in the areas of the physical addresses corresponding to the logical address AL. Then, a page-disabling section 3e disables the enabled area as described below. Furthermore, the address conversion section 3 updates the state table 2a, and rewrites the item regarding the state of the area from "enabled" to "disabled." Consequently, the read section 3b is prohibited from accessing to the area.

The page-disabling section 3e rewrites data inside the redundant area corresponding to the enabled page, thereby disabling the page. For example, it is defined that a page is enabled and disabled when the predetermined one bit (flag) inside the redundant area is "1" and "0," respectively. Since the flag corresponding to the enabled page is "1," the page-disabling section 3e changes the flag from "1" to "0," in other words, writes "0" into the flag inside the redundant area, thereby disabling the page.

As described above, the flash memory card 10 according to Embodiment 1, when requested the overwriting of data by the host H, writes new data in another area without erasing the original data. Furthermore, the card assigns the physical address of the area in which the new data is written to the logical address of the write target. In addition, the card disables states of the areas at the other physical addresses corresponding to the logical address. Consequently, when receiving from the host a read command aimed at the logical address, the read section 3b can access only the area storing the latest data items among a plurality of the areas corresponding to the logical address. Thus, the overwriting of data at the same logical address is realized without entailing an erasure of data in the flash memory 4. Therefore, the overwriting duration shortens by the erasing duration.

The flash memory card 10 according to Embodiment 1 further comprises a merge control section 3f inside the flash memory controller 3. As described above, the overwriting of data produces disabled pages. Accordingly, the ratio of the disabled areas to the enabled areas increases when the overwriting of data is repeated. The merge control section 3f controls the read section 3b, the write section 3c, the erase section 3d, and the page-disabling section 3e as follows, thereby copying data on the enabled pages inside a predetermined physical block onto the blank pages inside other physical blocks. Furthermore, the merge control section erases the original data in the physical block, thereby increasing the number of the physical blocks including only blank pages (the blank physical blocks). As a result, the ratio of the disabled areas to the enabled areas can be reduced.

Figure 3:
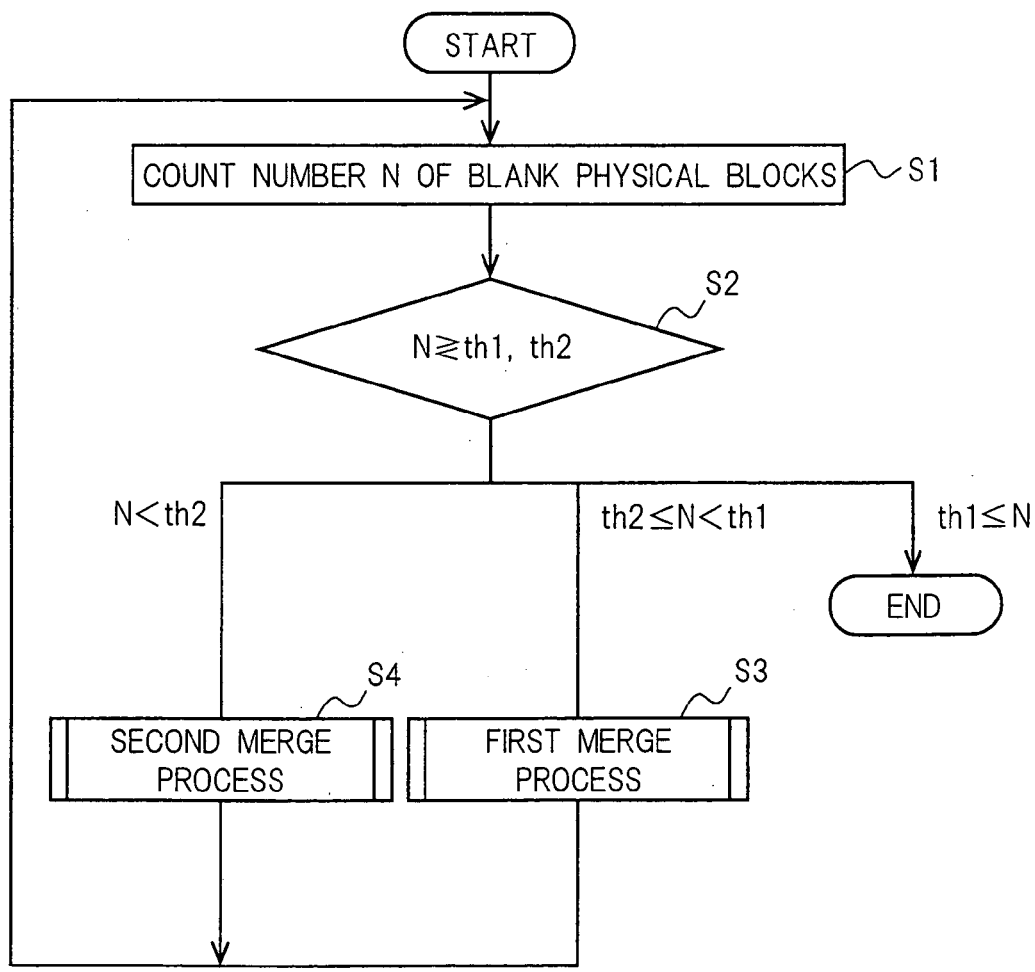
FIG. 3 is a flow chart about operations of a merge control section 3*f* according to Embodiment 1 of the present invention.

FIG. 3 is a flow chart showing the operation of the merge control section 3f.

The merge control section 3f starts up at the time of writing of data into the flash memory 4.

Step S1:

The merge control section 3f consults the state table 2a inside the buffer 2 and counts the number N of the blank physical blocks.

Step S2:

The number N of the blank physical blocks counted in Step S1 is compared with each of the first threshold value th1 and the second threshold value th2. Here, the first threshold value th1 and the second threshold value th2 are, for example, equal to about 50% and about 20% of the number of all the physical blocks inside the cell array 4b, respectively. Furthermore, the merge control section 3f causes the process to branch as follows, depending on the result of comparison. (1) The merge control section 3f stops when the number N of the blank physical blocks is equal to or more than the first threshold value th1 (N≧th1). (2) The merge control section 3f performs the first merge process S3 when the number N of the blank physical blocks is smaller than the first threshold value th1 and equal to or more than the second threshold value th2 (th2≦N<th1). (3) The merge control section 3f performs the second merge process S4 when the number N of the blank physical blocks is smaller than the second threshold value th2 (N<th2).

Through Step S1 and Step S2, the merge control section 3f performs the following merge process only when the number N of the blank physical blocks is smaller than the first threshold value th1, in other words, only when the remaining area available for the data writing is small. Thus, the flash memory card 10 according to Embodiment 1 limits the extension of the writing duration due to the merge process.

<The First Merge Process S3>

Figure 4:
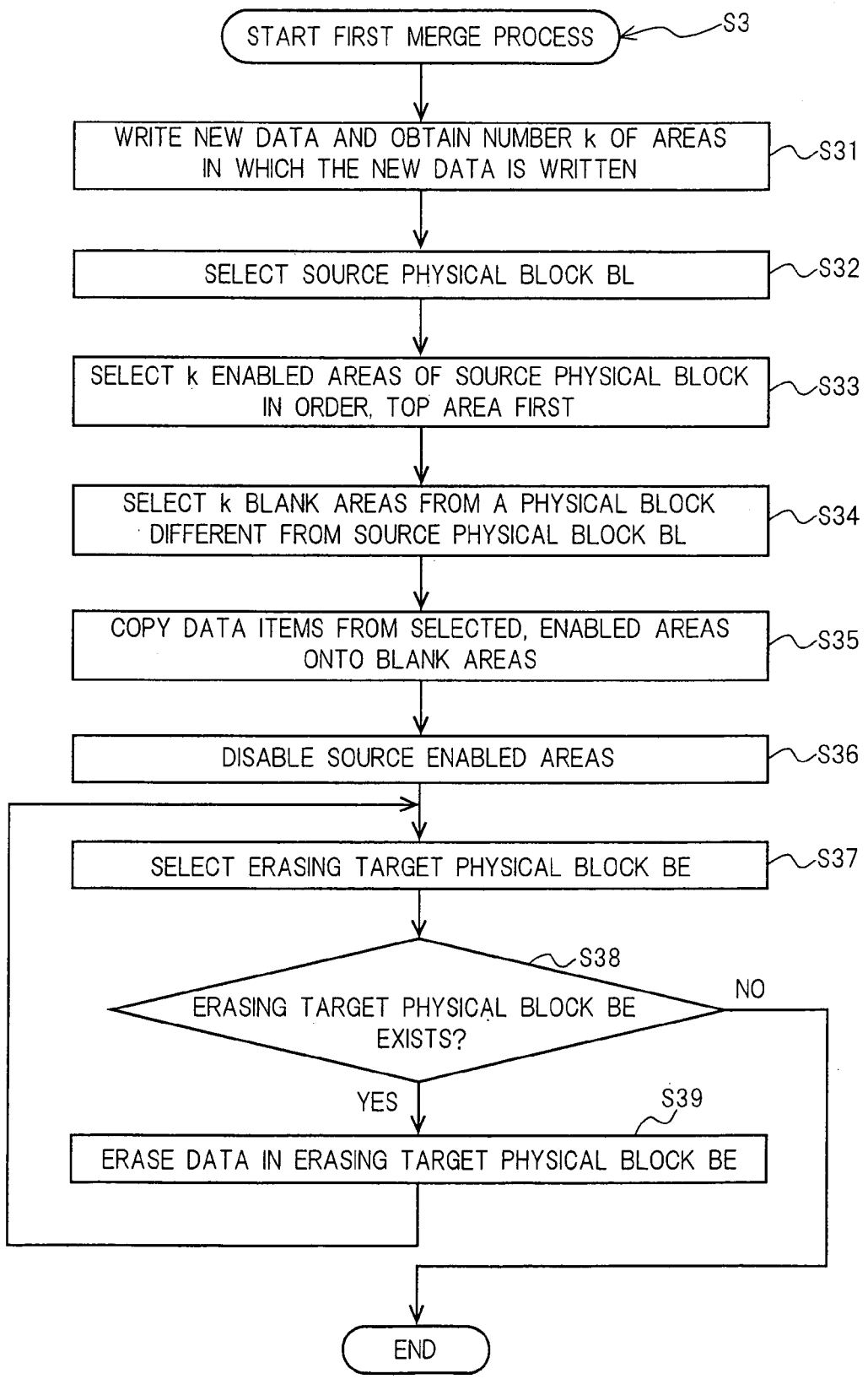
FIG. 4 is a flow chart about the first merge process S3, one of the operations of the merge control section 3*f* according to Embodiment 1 of the present invention.
Figure 5:
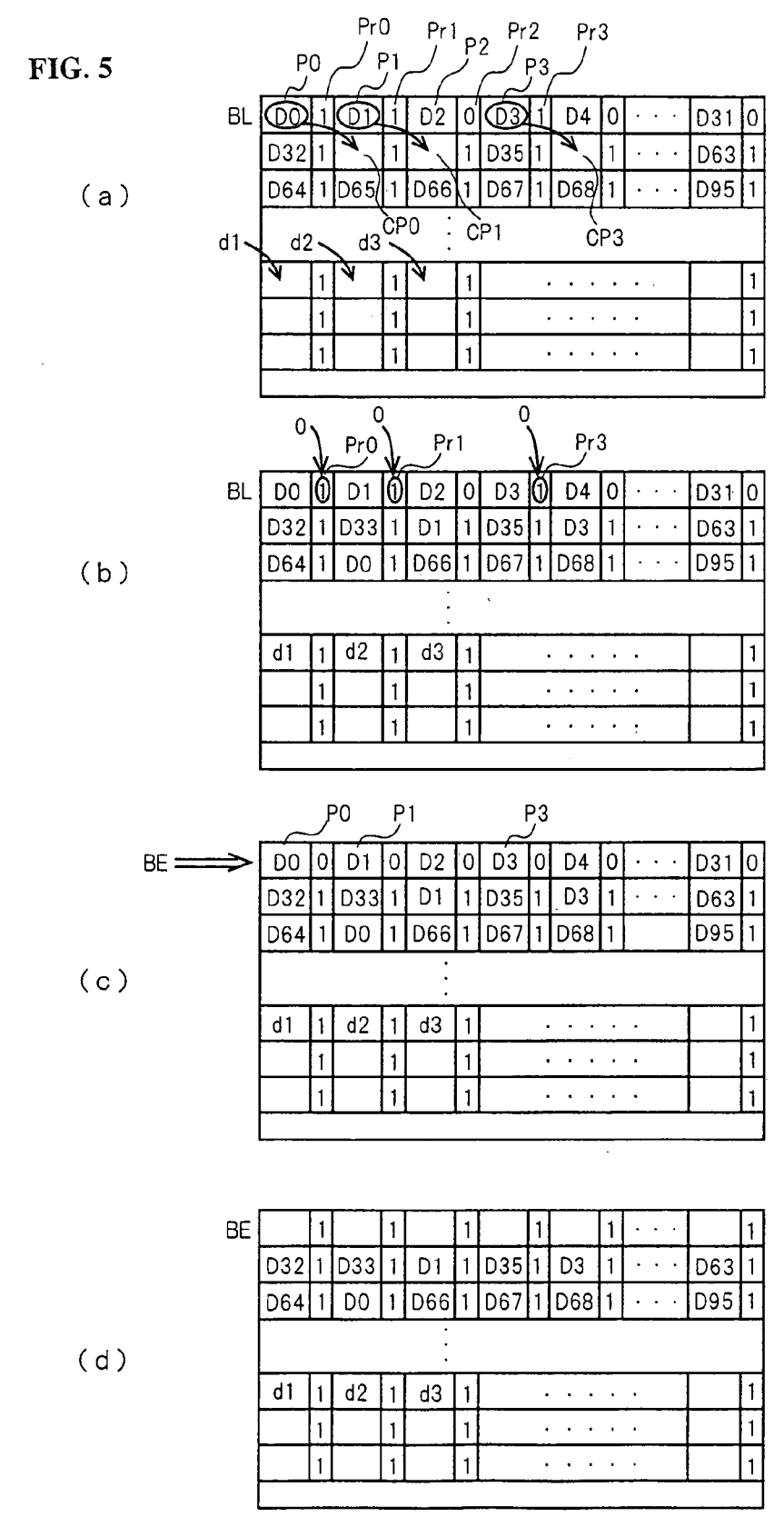

FIG. 4 is a flow chart showing the first merge process S3. FIG. 5 is a schematic diagram showing changes in the states of the pages inside the cell array 4b during the first merge process S3. In Embodiment 1, the corresponding pages in one of the odd-numbered physical blocks and one of the even-numbered physical blocks belong to the same area. Furthermore, the data input/output operations are performed area by area in parallel. Accordingly, the changes in states of pages are substantially common between the odd-numbered physical blocks and the even-numbered physical blocks. Therefore, FIG. 5 shows only the odd-numbered physical blocks inside the cell array 4b.

FIG. 5 represents the data items stored in the respective areas P0, P1, P2, etc. as the reference symbols D0, D1, D2, etc. written inside the boxes showing the respective areas. In addition, the states of the areas are represented as the numerals 1 and 0 written inside the boxes showing the corresponding redundant areas Pr0, Pr1, Pr2, etc. Here, the numerals 1 and 0 show the enabled and disabled states, respectively. Furthermore, the states of the areas are blank when the boxes showing the areas are blank.

Substep S31:

As shown in (a) of FIG. 5, new data items (for example, d1, d2, and d3) are written into the blank areas. Then, the merge control section 3f obtains the number k (for example, 3) of the blank areas in which the new data items are written.

Substep S32:

The merge control section 3f consults an address table 2b inside the buffer 2, and selects the physical block BL as a source of copying in decreasing order of the number of the disabled areas, the physical block including the largest number of the disabled areas first. Here, the address table 2b is a list of the addresses of the physical blocks and the numbers of the disabled pages belonging to the physical blocks. For example, the top physical block BL is selected as the source physical block in (a) of FIG. 5.

Substep S33:

The merge control section 3f consults the state table 2a inside the buffer 2, and selects the same number of the enabled areas of the source physical block BL as the number of the areas obtained in Substep S31, that is, k areas in order, the top area P0 first. For example, the three enabled areas P0, P1, and P3 are selected in (a) of FIG. 5. Here, when the number of the enabled areas inside the source physical block BL is smaller than k, Substep S32 is performed again, and thereby selecting another physical block as a source physical block and the rest of the enabled areas are selected from the physical block.

Substep S34:

The merge control section 3f consults the state table 2a inside the buffer 2 and selects the same number of blank areas as the number of the areas obtained in Substep S31, that is, k areas from a physical block different from the source physical block BL. For example, the three blank areas CP0, CP1, and CP3 are selected in (a) of FIG. 5.

Substep S35:

The merge control section 3f reads data items from the enabled areas selected in Substep S33 using the read section 3b. The data items read are temporarily stored in the buffer 2. Furthermore, the merge control section 3f writes the data items temporarily stored in the buffer 2 into the respective blank areas selected in Substep S34 using the write section 3c. Thus, data items on the k enabled areas inside the source physical block BL are copied into the respective blank areas of the other physical blocks. For example, the data items D0, D1, and D3 in the three enabled areas P0, P1, and P3 inside the source physical block BL are copied into the three blank areas CP0, CP1, and CP3, respectively, in (a) of FIG. 5.

Substep S36:

The merge control section 3f disables the k enabled areas inside the source physical block BL using the page-disabling section 3e. In (b) of FIG. 5, for example, data in the redundant areas Pr0, Pr1, and Pr3 corresponding to the three enabled areas P0, P1, and P3 inside the source physical block BL is changed from "1" to "0." Furthermore, the merge control section 3f updates the state table 2a inside the buffer 2, and rewrites the items regarding the states of the k enabled areas inside the source physical block BL from "enabled" to "disabled." In conjunction with that, the merge control section 3f updates the address table 2b inside the buffer 2 based on the state table 2a updated.

Substep S37:

The merge control section 3f consults the state table 2a inside the buffer 2 and selects the physical block including only disabled areas, or alternatively, only a large number of disabled areas and a small number of blank areas, and assigns the physical block as an erasing target physical block BE. In (c) of FIG. 5, for example, the top physical block BE is selected as an erasing target since the states of all the areas inside the physical block BE are disabled.

Substep S38:

It is checked whether an erasing target physical block BE can be selected in Substep S37. The merge control section 3*f* causes the process to branch to Substep S39 when an erasing target physical block BE exists, and finishes the first merge process S3 at other times.

Substep S39:

The merge control section 3*f* performs the erasing of data for the erasing target physical block BE using the erase section 3*d*. In (d) of FIG. 5, for example, all the boxes showing the areas inside the erasing target physical block BE are drawn as blank boxes so as to represent that the states of all the areas are changed into blank states. After the end of the data erasing, the merge control section 3*f* updates the state table 2*a* inside the buffer 2, and rewrites "enabled" into the items regarding the states of all the areas of the erasing target physical block BE. In conjunction with that, the merge control section 3*f* updates the address table 2*b* inside the buffer 2 based on the updated state table 2*a*. Then, the merge control section 3*f* repeats the process from Substep S37.

As described above, the first merge process S3 is performed at each time of the data writing when the number N of the blank physical blocks is smaller than the first threshold value th1. Generally the amounts of the data objects to be written are equal to the storage capacity to be on the order of the integral multiple of the physical block. On the other hand, in Substep S33, the merge control section 3*f* selects as many enabled areas as the areas in which new data is written. Accordingly, generally the number of physical blocks that become erasable through the first merge process S3 can be adjusted to be on the order of the number of the blank physical blocks consumed by the writing of new data, especially when data is overwritten into the same logical address. As a result, the flash memory card 10 according to Embodiment 1 can suppress an increase in the ratio of the disabled areas to the enabled areas at the time of the repetition of the overwriting of data.

<The Second Merge Process S4>

Figure 6:
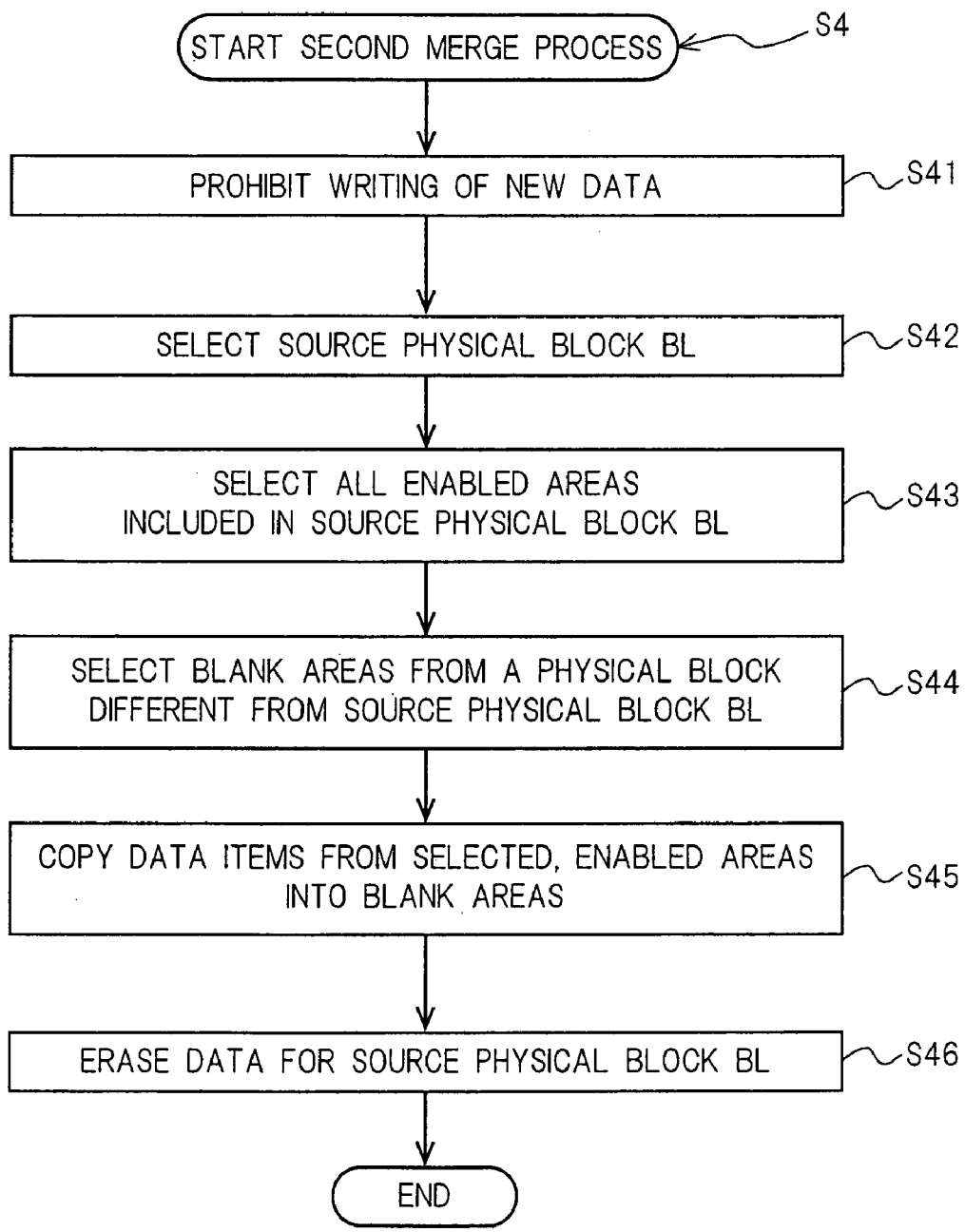
FIG. 6 is a flow chart about the second merge process S4, another of the operations of the merge control section 3f according to Embodiment 1 of the present invention.
Figure 7:
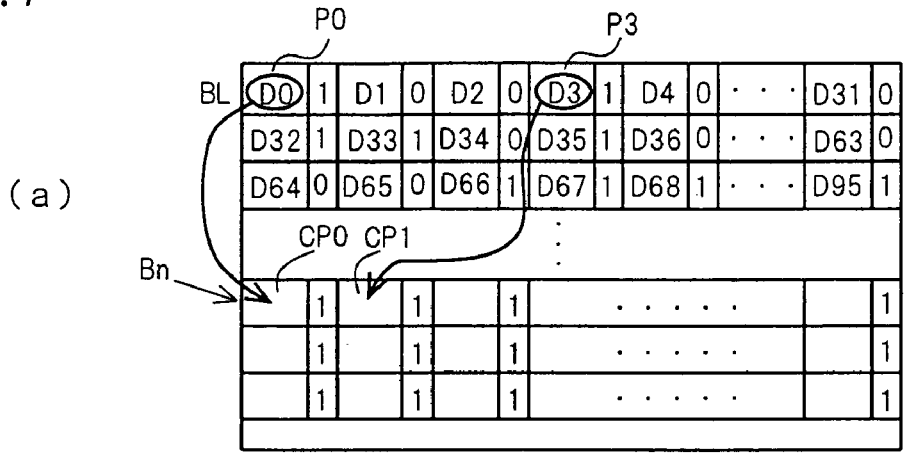
FIG. 7 is a schematic diagram showing changes in the states of the pages inside the flash memory 4 during the second merge process S4 according to Embodiment 1 of the present invention.
Figure 7:
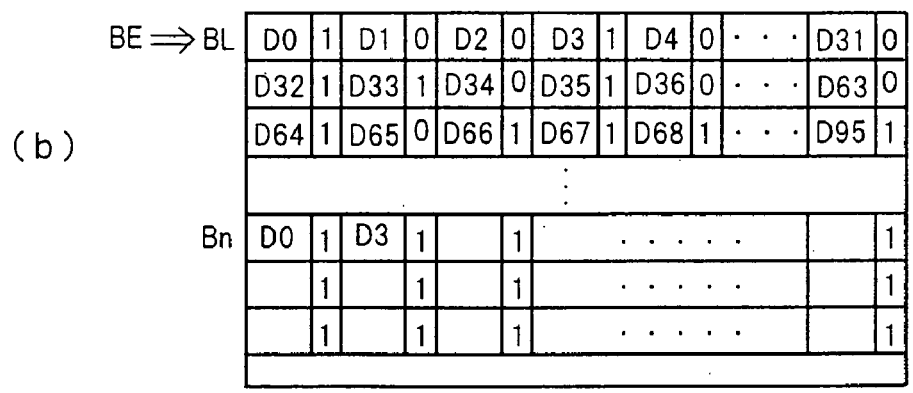
Figure 7:
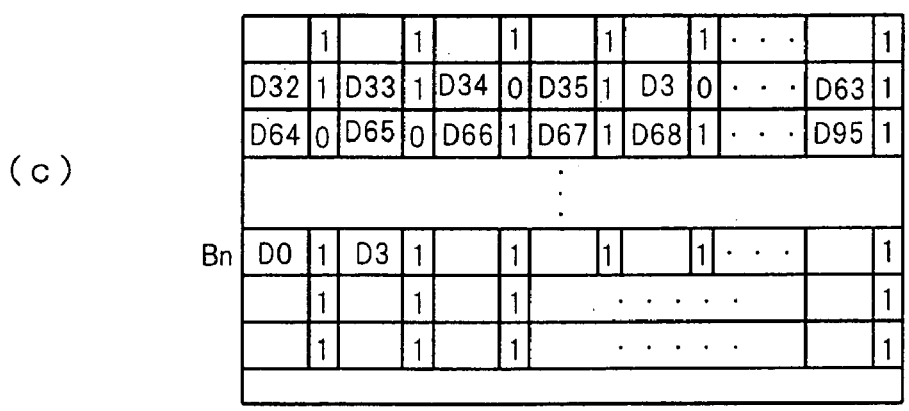

FIG. 6 is a flow chart showing the second merge process S4. FIG. 7 is a schematic diagram showing changes in the states of the pages inside the cell array 4*b* during the second merge process S4. FIG. 7 shows only the odd-numbered physical blocks inside the cell array 4*b* in a manner similar to FIG. 5. Furthermore, data items stored in the areas and the states of the areas are shown as reference symbols similar to those shown in FIG. 5.

Substep S41:

The merge control section 3*f* prohibits the write section 3*c* from writing new data in contrast to the time of the first merge process S3.

Substep S42:

The merge control section 3*f* consults the address table 2*b* inside the buffer 2 and selects the source physical block BL. The blocks are selected in decreasing order of the number of the disabled areas, with the physical block including the largest number of the disabled areas first, in a manner similar to Substep S32 of the first merge process S3. In (a) of FIG. 7, for example, the top physical block BL is selected as the source physical block.

Substep S43:

The merge control section 3*f* consults the state table 2*a* inside the buffer 2 and selects all the enabled areas inside the source physical block BL. In (a) of FIG. 7, for example, all the enabled areas P0 and P3 inside the physical block BL are selected.

Substep S44:

The merge control section 3*f* consults the state table 2*a* inside the buffer 2 and selects the same number of blank areas as the number of enabled areas selected in Substep S43 and from a physical block different from the source physical block BL. In (a) of FIG. 7, for example, the top two areas CP0 and CP1 inside the one Bn of the blank physical blocks are selected.

Substep S45:

The merge control section 3*f* reads data items from the enabled areas selected in Substep S43 using the read section 3*b*. The data items read are temporarily stored in the buffer 2. Furthermore, the merge control section 3*f* writes the data items temporarily stored in the buffer 2 into the respective blank areas selected in Substep S44 using the write section 3*c*. Thus, the data items in all the enabled areas inside the source physical block BL are copied into the respective blank areas of another physical block. In (a) of FIG. 7, for example, the data items D0 and D3 in the enabled areas P0 and P3 inside the source physical block BL are copied into the two blank areas CP0 and CP1 of the blank physical block Bn, respectively.

Substep S46:

The merge control section 3*f* selects the source physical block BL as an erasing target physical block BE as shown in (b) of FIG. 7. Furthermore, the merge control section performs the erasing of data for the erasing target physical block BE using the erase section 3*d*. In (c) of FIG. 7, for example, all the boxes showing the areas inside the erasing target physical block BE are drawn as blank boxes so as to represent that the states of all the areas are changed into blank states. After the end of the data erasing, the merge control section 3*f* updates the state table 2*a* inside the buffer 2 and rewrites "enabled" into the items regarding the states of all the areas inside the erasing target physical block BE. In conjunction with that, the merge control section 3*f* updates the address table 2*b* inside the buffer 2 based on the state table 2*a* updated.

As described above, the second merge process S4 is performed when the number N of the blank physical blocks is smaller than the second threshold value th2. At that time, the writing of new data is prohibited, and the producing of an increase in the number N of the blank physical blocks through Substeps S42–S46 is placed at a higher priority. Consequently, the ratio of the disabled areas to the enabled areas is reduced so that the number N of the blank physical blocks is secured at or beyond the second threshold value th2. As a result, the flash memory card 10 according to Embodiment 1 increases the amounts of data that can be stored therein.

The flash memory 4 comprises the two page buffers 4*a* in Embodiment 1. Alternatively, the flash memory may comprise only one page buffer, or three or more of the page buffers.

Embodiment 2

Figure 8:
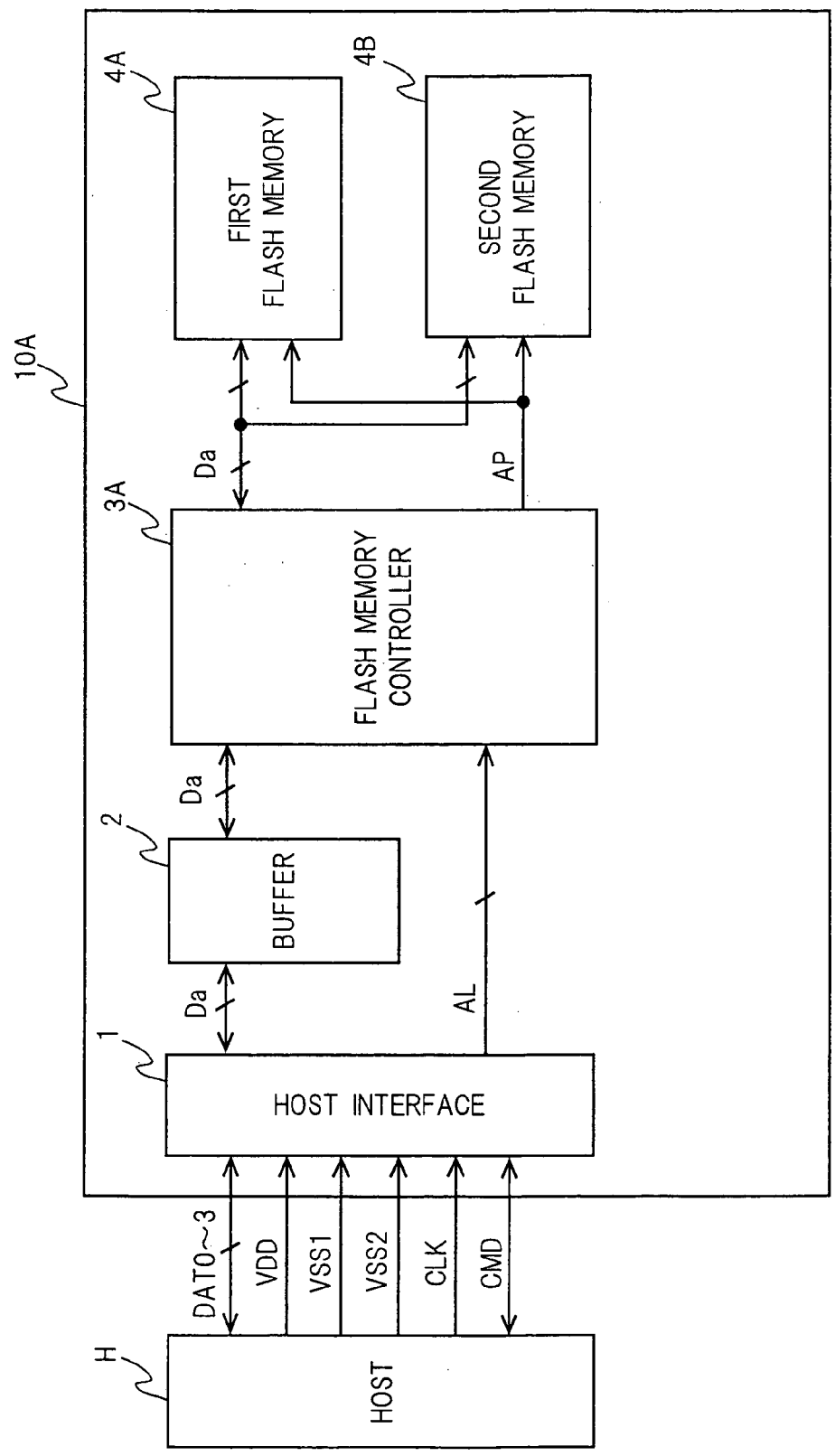
FIG. 8 is a block diagram showing data exchanges between a flash memory card 10A according to Embodiment 2 of the present invention and a host H.

FIG. 8 is a block diagram showing data exchanges between a flash memory card 10A according to Embodiment 2 of the present invention and a host H. The flash memory card 10A according to Embodiment 2 comprises two flash memories in contrast to the counterpart 10 of Embodiment 1 (FIG. 1). In FIG. 8, components similar to those of Embodiment 1 are marked with the same reference symbols as those of Embodiment 1. Furthermore, the description of Embodiment 1 is cited regarding those similar components.

A flash memory controller 3A and two flash memories 4A and 4B according to Embodiment 2 are really similar in internal structure to their respective counterparts 3 and 4 of Embodiment 1, and therefore FIG. 1 is cited regarding them.

The duration of data transfer between the flash memory controller 3A and the flash memory 4A or 4B inside the page buffers 4a is on the order of several tens of nsec. On the other hand, the duration of writing data from the page buffer 4a into the cell array 4b is on the order of several hundreds of nsec. Using the difference between those processing times, the flash memory controller 3A according to Embodiment 2 performs a writing operation of data into one of the flash memories and a merge process in the other of the flash memories in parallel as described below. Consequently, the extension of the writing duration due to the merge process can be reduced compared with that of the flash memory card 10 according to Embodiment 1.

For example, when writing data into the first flash memory 4A, a write section 3c inside the flash memory controller 3A transfers the data object Da to be written into the first flash memory 4A area by area, in a manner similar to that of Embodiment 1. The merge control section 3f inside the flash memory controller 3A, at every time of the transfer of the one area, starts up and performs Step S1 and Step S2 for the second flash memory 4B in a manner similar to that of Embodiment 1. The merge control section 3f further performs the first merge process S3 or the second merge process S4 according to the result of the comparison in Step S2, in a manner similar to that of Embodiment 1.

<The First Merge Process S3>

In the first merge process S3 according to Embodiment 2, in contrast to that of Embodiment 1, the merge control section 3f obtains in Substep S31 the number of the areas in which new data is written inside the first flash memory 4A. In Substep S33, enabled as many areas as the areas in which new data is written inside the first flash memory 4A are selected from the source physical block inside the second flash memory 4B. Consequently, one area of the second flash memory 4B is copied into another area in parallel with the writing of data in one area into the first flash memory 4A. Furthermore, the number of the target areas of the first merge process S3 in the second flash memory 4B is equal to the number of the write target areas in the first flash memory 4A. Accordingly, the duration required of the first merge process S3 in the second flash memory 4B is nearly equal to the writing duration in the first flash memory 4A. As a result of the above-described operations, the extension of the writing duration due to the first merge process S3 can be reduced in Embodiment 2, compared with that in Embodiment 1.

<The Second Merge Process S4>

In the second merge process S4 according to Embodiment 2, in contrast to that of Embodiment 1, the merge control section 3f allows the data writing into the first flash memory 4A. Consequently, the data writing into the first flash memory 4A can be performed in parallel with the second merge process S4 in the second flash memory 4B. Therefore, the extension of the writing duration due to the second merge process S4 can be reduced in Embodiment 2, compared with that in Embodiment 1.

Embodiment 3

Figure 9:
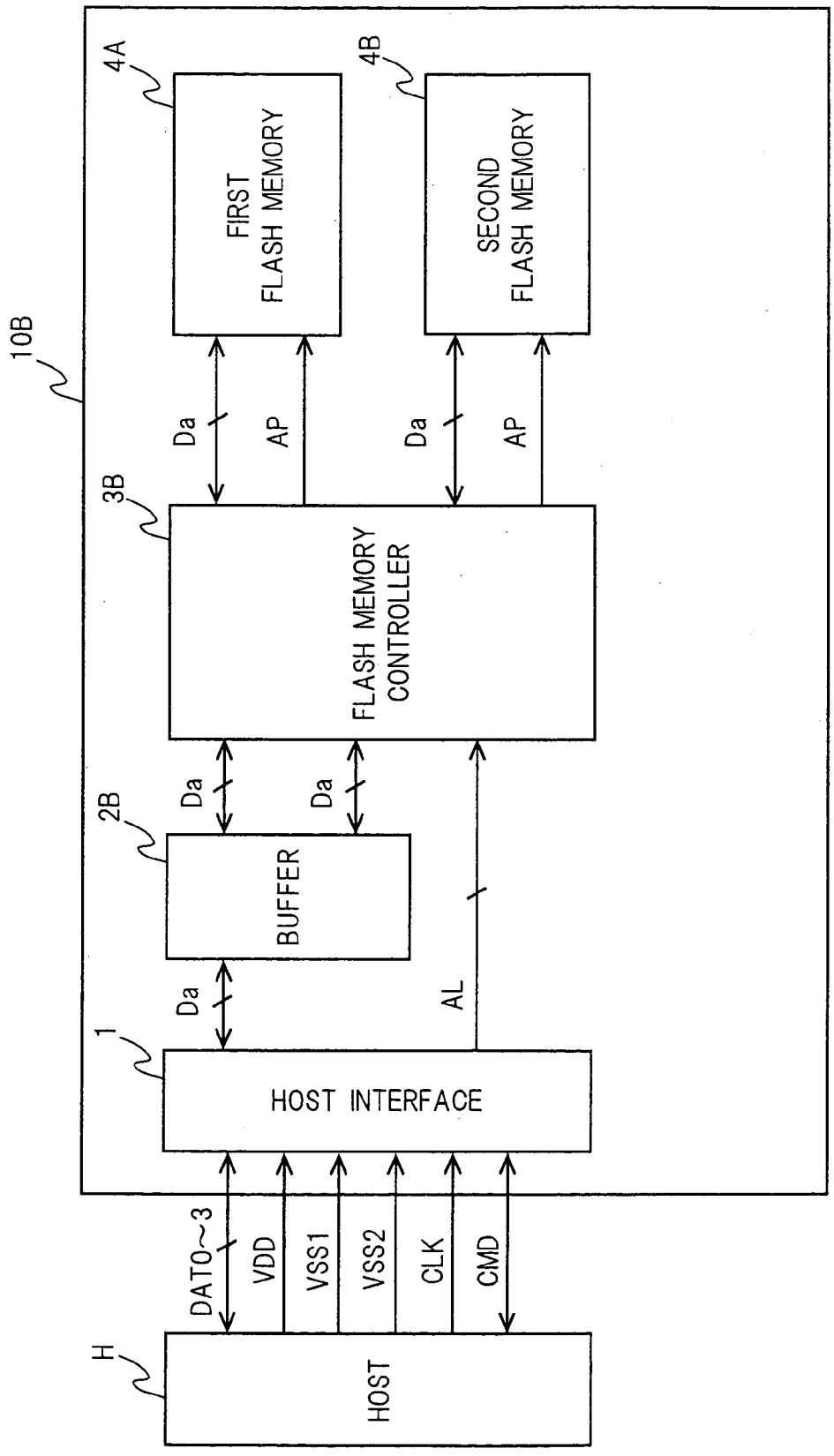
FIG. 9 is a block diagram showing data exchanges between a flash memory card 10B according to Embodiment 3 of the present invention and a host H.
Figure 10:
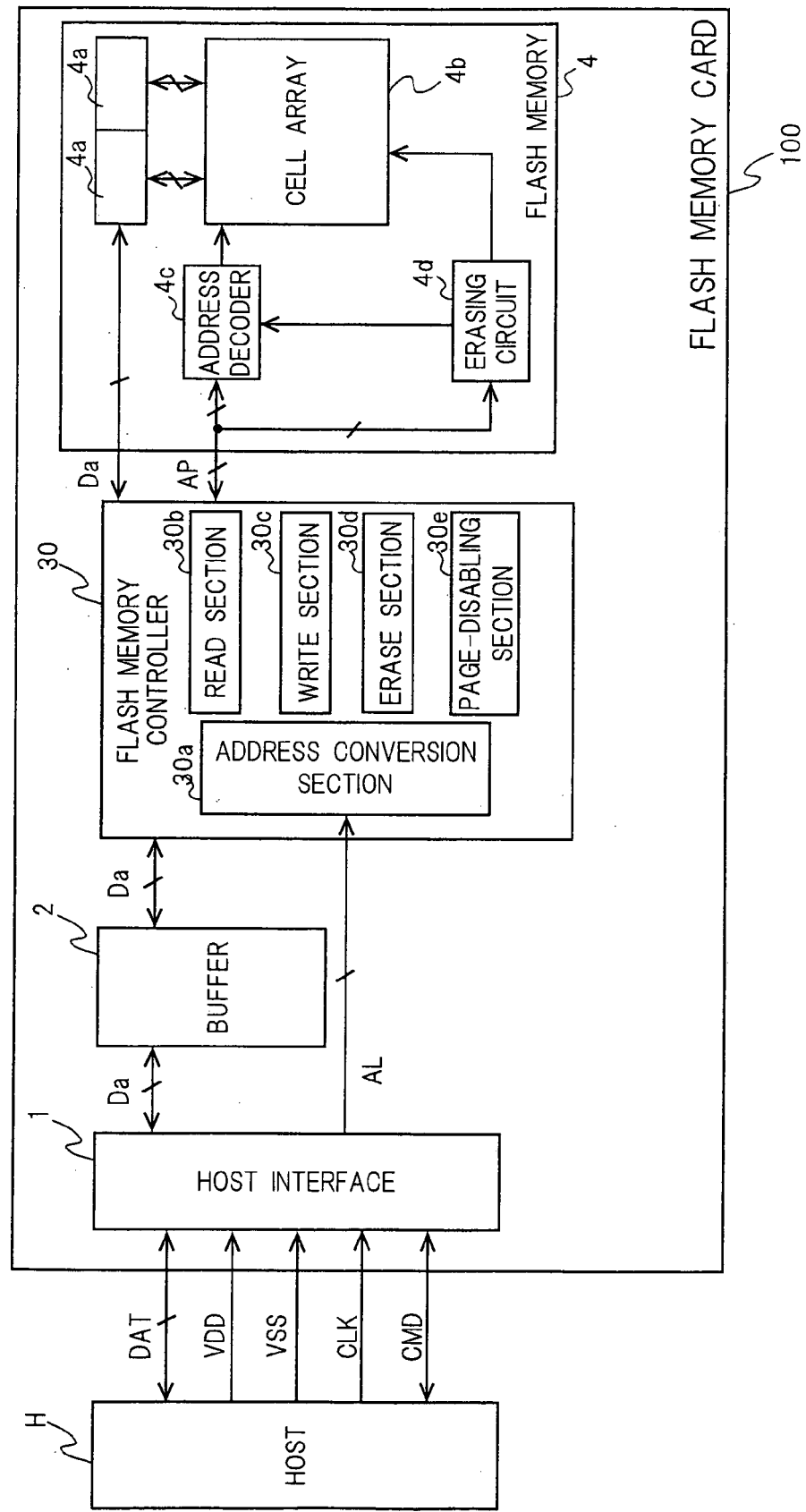
FIG. 10 is a block diagram showing an example of data exchanges between a conventional flash memory card 100 and a host H.

FIG. 9 is a block diagram showing data exchanges between a flash memory card 10B according to Embodiment 3 of the present invention and a host H. The flash memory card 10B according to Embodiment 3 comprises two flash memories in a manner similar to the counterpart 10A of Embodiment 2 (FIG. 8). In FIG. 9, components similar to those of Embodiment 1 are marked with the same reference symbols as those of Embodiment 1. Furthermore, the description of Embodiment 1 is cited regarding those similar components.

The two flash memories 4A and 4B according to Embodiment 3 are really similar in internal structure to their counterpart 4 of Embodiment 1, and therefore FIG. 1 is cited regarding them.

A flash memory controller 3B according to Embodiment 3 includes two internal structures, each of which is similar to that of its counterpart 3 according to Embodiment 1. Of the internal structures similar to that of the flash memory controller 3 according to Embodiment 1, one is connected to the first flash memory 4A, and the other is separately connected to the second flash memory 4B. Furthermore, the internal structures are separately connected to the buffer 2B through the separate data buses. Because of such composition, the flash memory card 10B according to Embodiment 3 can perform the writing operation and the merge process in parallel for the two flash memories 4A and 4B in a manner similar to that of Embodiment 2. In contrast to Embodiment 2, in particular, data transmissions between the buffer 2B and the flash memory controller 3B and data transmissions between the flash memory controller 3B and the flash memories 4A and 4B are also performed in parallel. Accordingly, the writing duration can be further decreased by the data transfer duration compared with that of Embodiment 2.

As described above, the flash memory system according to the present invention can copy data on the enabled pages inside a predetermined physical block into other physical blocks. Furthermore, at the end of the copying of data on all the enabled pages inside the predetermined physical block, the system can collectively erase data in the physical block. Through such a merge process, the flash memory system according to the present invention can erase data on the disabled pages inside the physical block including enabled pages, in contrast to conventional systems. Accordingly, the flash memory system according to the present invention can reduce the rate of the disabled pages to the enabled pages. As a result, the amount of data that can be stored at the time of the repetition of the overwriting of data is larger than that of the conventional systems.

The flash memory system according to the present invention may further perform the above-described merge process when new data is written therein and the number of blank physical blocks is smaller than the first threshold value. Thus, the above-described flash memory system can reduce the extension of the writing duration due to the copying of data by the restriction of the execution timing of the merge process.

The flash memory system according to the present invention may adjust the number of the source pages to be equal to or more than the number of the pages on which new data is written. Consequently, when data is overwritten at the same logical address, the system can adjust the number of the physical blocks erased in the above-described merge process to be greater than or equal to the number of blank physical blocks consumed by the writing of new data. As a result, the system can avoid an increase in the ratio of the disabled pages to the enabled pages at the time of the repetition of the overwriting of data. Therefore, the system can increase the amounts of data that can be stored.

The flash memory system according to the present invention may provide the above-described merge process with a higher priority than the writing operation of new data when the number of the blank physical blocks is smaller than the second threshold value. Consequently, the system can reduce the rate of the disabled pages to the enabled pages so as to secure the number of the blank physical blocks equal to or greater than threshold value. As a result, the system can increase the amounts of data that can be stored.

The second threshold value is smaller than the first threshold value when the above-described flash memory system performs both the operation in the case of the number of the blank physical blocks equal to or smaller than the first threshold value and the operation in the case of the number equal to or smaller than the second threshold value. Consequently, the merge process does not take precedence over the writing operation of new data until the blank physical blocks are too small in number to allow the writing of new data therein. As a result, the extension of the writing duration due to the merge process can be reduced.

The flash memory system according to the present invention may comprise a list of the addresses of the physical blocks and the numbers of the disabled pages belonging to the physical blocks. The above-mentioned list is consulted at the time of the selection of the source physical block in the above-described merge process. Consequently, the source physical block is selected easily and quickly in decreasing order of the number of the disabled areas, the physical block including the largest number of the disabled areas first. As a result, the time required for the above-described merge process decreases since the number of the enabled pages targeted for the above-described merge process is minimized.

The above-described disclosure of the invention in terms of the presently preferred embodiments is not to be interpreted as limiting. Various alterations and modifications will no doubt become apparent to those skilled in the art to which the invention pertains, after having read the disclosure. As a corollary to that, such alterations and modifications are deemed to fall within the true spirit and scope of the invention. Furthermore, it is to be understood that the appended claims are intended to cover any alterations and modifications.

INDUSTRIAL APPLICABILITY

According to the present invention, for flash memories, the per-physical-block ratio of the disabled pages to the enabled pages can be maintained at a low value. Consequently, a substantial increase in the storage capacity can be achieved for the flash making the industrial applicability in the present invention is very high.

What is claimed is:

1. A flash memory system comprising:
   (A) a flash memory comprising more than one physical block including more than one page, each page having (a) a fixed memory capacity and (b) three states, namely, blank, enabled, and disabled states;
   (B) an address conversion section for converting a logical address entered from the outside into one of the corresponding physical addresses of said pages;
   (C) a read section for reading data from said enabled page;
   (D) a write section for writing data onto each of said blank pages;
   (E) an erase section for collectively erasing data in each of said physical blocks;
   (F) a page-disabling section for disabling said enabled pages; and
   (G) a merge control section for, when said write section writes new data,
      (a) counting the number of said physical blocks including only said blank pages (which are hereafter referred to as blank physical blocks);
      (b) selecting a source among said physical blocks in the case of the number of said blank physical blocks smaller than a first threshold value;
      (c) selecting, as a source page, said enabled page belonging to said source physical block and substantially as many as said pages on which said new data is written;
      (d) copying data on said source page onto said blank page using said read and write sections;
      (e) disabling said source page using said page-disabling section;
      (f) selecting said physical block including none of said enabled pages as a erasing target physical block; and
      (g) performing erasing of data using said erase section for the erasing target physical block, only in the case of said erasing target physical block selected.

2. The flash memory system according to claim 1, wherein when said write section writes new data, said merge control section:
   (A) prohibits said write section from writing new data and selects said source physical block in the case of the number of said blank physical blocks smaller than a second threshold value (here, said second threshold value is smaller that said first threshold value);
   (B) copies all data on said enabled pages belonging to said source physical block onto said blank pages belonging to one of said physical blocks different from said source physical block; and
   (C) erases data in said source physical block using said erase section.

3. The flash memory system according to claim 1 further comprising an address memory for storing a list of the addresses of said physical blocks and the numbers of said disabled pages belonging to the physical blocks.

4. The flash memory system according to claim 1, wherein:
   (A) a predetermined number of said pages belonging to each of said separate physical blocks are assigned to one area;
   (B) said read section reads data in parallel from more than one of said enabled pages belonging to said same area;
   (C) said write section writes data in parallel onto more than one of said blank pages belonging to said same area; and
   (D) said page-disabling section disables all of said enabled pages belonging to said same area.

5. The flash memory system according to claim 1, wherein:
   said flash memory system comprises two or more of said flash memories; and
   at least two of said read section, said write section, said erase section, said page-disabling section, and said merge control section operate in parallel with each other for said respective flash memories.

6. A method for merging data items stored in a flash memory comprising more than one physical block including more than one page, each page having (a) a fixed memory capacity and (b) three states, namely, blank, enabled, and disabled states, the method when writing new data into said flash memory comprising the steps of:
   (A) counting the number of said physical blocks including only said blank pages;

(B) comparing the count with a first threshold value;
(C) performing writing of new data and obtaining the number of said target pages of the writing in the case of said count smaller than the first threshold value;
(D) selecting a source among said physical blocks;
(E) selecting, as a source page, said enabled page belonging to said source physical block and substantially as many as said pages on which said new data is written;
(F) copying data of said source page onto said blank page;
(G) disabling said source page;
(H) selecting said physical block including none of said enabled pages as an erasing target physical block; and
(I) erasing data in said erasing target physical block only in the case of the erasing target physical block selected.

7. The method for merging data items stored in a flash memory according to claim 6, comprising the further steps of:

(A) comparing said count with a second threshold value smaller than said first threshold value;
(B) prohibiting writing of said new data in the case of the count smaller than the second threshold value;
(C) selecting, as source pages, all data of said enabled pages belonging to said source physical block;
(D) copying data of said source page onto said blank page belonging to said physical block different from said source physical block; and
(E) erasing data in said source physical block.

8. The method for merging data items stored in a flash memory according to claim 6, wherein the step of selecting said source physical block comprises a substep of consulting a list of addresses of said physical blocks and a quantity of said disabled pages belonging to the physical blocks.

* * * * *

UNITED STATES PATENT AND TRADEMARK OFFICE
CERTIFICATE OF CORRECTION

PATENT NO. : 7,039,781 B2 Page 1 of 1
APPLICATION NO. : 10/481921
DATED : May 2, 2006
INVENTOR(S) : Kazuya Iwata et al.

It is certified that error appears in the above-identified patent and that said Letters Patent is hereby corrected as shown below:

Title Page, Section (54):

The title should read -- FLASH MEMORY SYSTEM AND METHOD FOR MERGING STORED DATA ITEMS --.

Signed and Sealed this

Fifth Day of December, 2006

JON W. DUDAS
*Director of the United States Patent and Trademark Office*